United States Patent
Gaul et al.

(10) Patent No.: US 9,783,071 B2
(45) Date of Patent: Oct. 10, 2017

(54) DEVICE AND METHOD FOR PROVIDING A QUANTITY OF ENERGY IN SAID SUPPLY DEVICE FOR CONSUMER

(75) Inventors: Armin Gaul, Selm (DE); Ingo Diefenbach, Unna (DE)

(73) Assignee: innogy SE, Essen (DE)

(*) Notice: Subject to any disclaimer, the term of this patent is extended or adjusted under 35 U.S.C. 154(b) by 557 days.

(21) Appl. No.: 13/359,192

(22) Filed: Jan. 26, 2012

(65) Prior Publication Data

US 2012/0140371 A1 Jun. 7, 2012

Related U.S. Application Data

(63) Continuation of application No. PCT/EP2010/060164, filed on Jul. 14, 2010.

(30) Foreign Application Priority Data

Jul. 27, 2009 (DE) .......................... 10 2009 034 887
Jul. 27, 2009 (EP) ..................................... 09166491

(51) Int. Cl.
*H02H 3/08* (2006.01)
*H02H 9/02* (2006.01)
(Continued)

(52) U.S. Cl.
CPC ......... *B60L 11/1816* (2013.01); *B60L 3/0069* (2013.01); *B60L 3/04* (2013.01); *B60L 11/1825* (2013.01); *H02J 7/0027* (2013.01); *H02J 7/0029* (2013.01); *G01R 31/007* (2013.01); *Y02T 10/7005* (2013.01); *Y02T 10/7055* (2013.01); *Y02T 10/7072* (2013.01); *Y02T 90/121* (2013.01); *Y02T 90/128* (2013.01); *Y02T 90/14* (2013.01)

(58) Field of Classification Search
CPC .......................... B60L 11/1816; B60L 3/0069
USPC ....................................................... 361/93.6
See application file for complete search history.

(56) References Cited

U.S. PATENT DOCUMENTS 4,833,406 A * 5/1989 Foster ........................... 324/225
6,072,291 A * 6/2000 Pedersen ........................ 318/362
(Continued)

FOREIGN PATENT DOCUMENTS

CN   1988098 A   6/2007
CN   1996695 A   7/2007
(Continued)

*Primary Examiner* — Thienvu Tran
*Assistant Examiner* — Lucy Thomas
(74) *Attorney, Agent, or Firm* — Reinhart Boerner Van Deuren P.C.

(57) ABSTRACT

Supply device for providing electrical energy to a consumer electrical circuit, containing a protection and monitoring device (50) assigned individually to the consumer, to the output of which the consumer electrical circuit can be connected via connecting means (10), wherein the protection and monitoring device (50) has sensor means (31, 32) for detecting at least one electrical quantity, and an analysis device (52) controlled by the sensor means (31, 32), which contains parameterization means for specifying in a predefinable manner at least one safety relevant triggering criterion, wherein on the at least one safety relevant triggering criterion being reached, a switching device (54) for the consumer electrical circuit can be controlled.

23 Claims, 2 Drawing Sheets

(51) Int. Cl.
*B60L 11/18* (2006.01)
*B60L 3/00* (2006.01)
*B60L 3/04* (2006.01)
*H02J 7/00* (2006.01)
*G01R 31/00* (2006.01)

(56) References Cited

U.S. PATENT DOCUMENTS

| | | | |
|---|---|---|---|
| 6,330,516 | B1 | 12/2001 | Kammeter |
| 7,804,274 | B2 * | 9/2010 | Baxter et al. ............... 320/109 |
| 7,952,325 | B2 * | 5/2011 | Baxter et al. ............... 320/109 |
| 8,025,526 | B1 * | 9/2011 | Tormey et al. ............. 439/528 |
| 8,063,605 | B2 * | 11/2011 | Tonegawa et al. .......... 320/107 |
| 8,278,875 | B2 * | 10/2012 | Hagenmaier et al. ....... 320/109 |
| 2006/0238932 | A1 | 10/2006 | Westbrock, Jr. et al. |

FOREIGN PATENT DOCUMENTS

| | | |
|---|---|---|
| CN | 101420114 A | 4/2009 |
| DE | 37 43 034 A1 | 3/1989 |
| DE | 37 43 064 A1 | 3/1989 |
| DE | 42 13 414 A1 | 10/1993 |
| DE | 101 51 163 A1 | 4/2003 |
| DE | 20 2008 009929 U1 | 1/2010 |
| EP | 1667303 A2 | 6/2006 |
| JP | 2000354332 A | 12/2000 |
| TW | M323757 U | 12/2007 |

\* cited by examiner

DEVICE AND METHOD FOR PROVIDING A QUANTITY OF ENERGY IN SAID SUPPLY DEVICE FOR CONSUMER

CROSS-REFERENCE TO RELATED PATENT APPLICATIONS

This patent application is a continuation of pending PCT Patent Application No. PCT/EP2010/060164, filed Jul. 14, 2010, which claims the benefit of German Application No. 102009034887.5, filed Jul. 27, 2009, and European Application No. 09166491.2, filed Jul. 27, 2009, the entire teachings and disclosure of which are incorporated herein by reference thereto.

FIELD OF THE INVENTION

The present invention relates to a method and a device for providing electrical energy to be supplied to a consumer, in particular for providing electrical energy to be supplied to an electric vehicle, and a system consisting of a charging station and an electric vehicle and an application to the charging process of an electric vehicle.

BACKGROUND OF THE INVENTION

The safety aspect plays a crucial role in connection with the supply of electrical consumers, in particular of electric vehicles. A technique is known in which a supply device, which in particular can be the charging station for an electric vehicle, is fitted with a plurality of different components, the individual function of which is described in the following:

First of all however, the supply device must have an energy quantity meter also known as an "electricity meter", with which the amount of electrical energy drawn from the energy supply company is detected and made available for further billing.

Such meters detect the phase current respectively provided in the mains electricity network, and the applied voltage. From this, they use multiplication and integration over time to determine the active energy quantity used expressed in units of Kilowatt hours.

The most widespread of these are so-called "Ferraris meters", which work according to the induction principle. According to this, the single phase or multiphase alternating current together and the mains voltage induce a rotating magnetic field in an aluminium disc, generating a torque in the disc due to eddy currents. This torque is proportional to the vector product of current and voltage. The aluminium disc runs in an eddy current brake consisting of a permanent magnet, which generates a braking moment proportional to the velocity. As a result, the aluminium disc, a section of the edge of which is visible from the outside through a window, has a velocity that is proportional to the active electrical power. The aluminium disc has a roller type meter associated with it, so that the energy throughput can be read off as a numerical value in kilowatt hours (kWh).

In the case of paying customers, for example those in private households, such electromechanical energy meters with two or more counters are used, in order to charge at different rates depending on the time of day. Switching takes place between these counters, for example by means of inbuilt or external ripple control receivers, which are controlled by central ripple control systems at the energy supply company's premises. In this way the energy consumption can be charged to the consumer at a cheaper rate in periods of low network loading, for example at night.

Other devices already know are digital electronic energy meters (so-called "SmartMeters"), which contain no mechanically mobile elements.

The current is detected by means of current transformers, for example with a soft magnetic toroidal core or a current measuring system with Rogowski coils, by means of a shunt resistance or using Hall elements. The charge for the energy consumed is calculated using an electronic circuit. The result is fed to an alphanumeric display, e.g. a liquid crystal display (LCD). Digital electronic energy meters have the particular advantage of being able to be read remotely and therefore make the annual reading that has been customary up to now redundant, since the meter data are transmitted electronically, for example over the internet, to the electricity provider.

Various forms of data interfaces for data transmission to the charging unit of the energy supply company are in use, e.g. infrared, SO-interface, M-Bus, zero-potential contact, EIB/KNX, or power line communication (PLC), in which the data are transmitted via the normal mains supply line.

In addition, as is known, a supply device for a consumer has monitoring devices, in order to guarantee their proper operation and, if necessary, to initiate appropriate protective measures in the event of overload of the supply device. With regard to their functionality, this involves switching means, which serve to connect or disconnect the consumer power circuit, fusing means, which are intended to protect the electrical circuits against damage due to excessive heating of the cables or short circuits, and fault current monitoring devices.

A switching means is constructed in a known manner as an electromagnetically activated switch ("trip switch"), in which a control current flows through a magnetic coil, the magnetic attraction mechanically activating a contact that closes the main electrical circuit. As long as the control current is flowing the switch is maintained in the closed position. Trip switches differ from relays in having higher switching powers.

Types of known residual current monitoring devices are in particular so-called FI switches (also known as RCD "Residual Current protective Devices"), which in the event of a defined difference current level being exceeded (in domestic systems typically 30 Ma), disconnect the current monitored circuit from the remaining network across all poles, i.e. with respect to all except the protective conductor.

To effect this, the RCD compares the level of the outgoing current with that of the return current. The signed sum of all currents flowing through the RCD in an intact system must be equal to zero. The comparison is carried out in a summing current transformer, which adds together all currents flowing to and from the consumer with their appropriate signs. If a current is being diverted to earth somewhere in the electrical circuit, then the sum of outgoing and return current in the summing current transformer is non-zero: a current difference $\Delta I$, which causes the triggering of the RCD and therefore the current supply to be switched off.

Fault current protection devices of type AC (AC-sensing) only detect sinusoidal fault currents. In practice therefore, pulsed-current sensing fault current protection devices of so-called "Type A" are commonly used. These detect both purely sinusoidal alternating currents and pulsing DC fault currents. This additional sensing capability is obtained by means of special magnetic materials for the toroidal tape cores that are used. Pulsed-current sensitive fault current protection devices work independently of the mains voltage.

Hardware components of the power electronics, such as e.g. frequency converters, rectifiers, uninterruptible power supplied (UPS), switch network parts or phase angle controllers, generate a bipolar, pulse-width modulated output voltage, which has switching frequencies in the range of up to 20 kHz. In case of a fault, these hardware components can also cause—as well as 50 Hz AC and DC-pulse fault currents—smooth DC fault currents and AC fault currents with a very wide range of frequencies, as well as mixed frequencies (in the case of frequency converters e.g. the switching frequency and output frequency). FI protection switches of Type A cannot accurately detect these fault currents, so that proper triggering of the FI-protection switch is not guaranteed to occur. Therefore, according to VDE 0160/EN 50178 "Equipping of heavy duty electrical systems with electronic hardware components", paragraph 5.2.11.2 and 5.3.2.3 for protection in the event of direct and indirect contact, an RCD of "Type B" is to be used, if an electronic component of an electrical system can generate a steady DC fault current in the fault condition.

Such so-called all-current sensitive fault current protection switches ("Type B") contain a second summing current transformer for detecting steady DC fault currents. An electronic unit transmits the switch-off command to the triggering device in the event of a fault. Monitoring for DC fault currents takes place in a manner that is independent of the mains voltage. Such a device therefore requires a supply voltage, which is tapped off the external supply lines and where appropriate the neutral line. The pulsed-current sensitive part of the switch is independent of this and works independently of the mains voltage, as in the case of Type A.

Fault current protection switches of the type described require sensors for highly accurate detection of the current and for subsequent processing of the measurement signal. In addition, regulations prescribe that FI switches in must be tested at specified time intervals. To do this, they are either activated manually or by additional devices provided for the purpose.

Finally, as a third component in a monitoring device of a supply device, excess current protection devices in the form of transmission line protection switches (LS switches or MCB "Miniature Circuit Breakers) are known. Transmission line protection switches are reusable, non-self activating resetting fuse elements, which switch off the electrical circuit automatically if an overload occurs. Devices of this kind protect transmission lines against damage due to overheating, which would result from the excess current flowing over an extended period.

An excess current can be caused by an overload or a short-circuit. If this is triggered in the event of overload, disconnection occurs if the specified nominal value of the current flowing through the transmission line protection switch is exceeded over an extended period of time. The time until triggering depends on the strength of the excess current—at high excess current it is shorter than it is for small excesses of the nominal current. To effect the triggering a bimetallic strip is used, which bends when heated by the flowing current and triggers the switch-off mechanism. The response time of an excess current protection device at different current strengths is termed the characteristic and is represented in current-time curves.

In the event of a short-circuit occurring in the system, a very rapid triggering, usually within a few milliseconds, must take place by means of an electromagnet in the transmission line protection switch that has current flowing through it. This requires sensors for the appropriate detection and circuit components for further processing of the measurement signal. Transmission line protection switches can also be manually triggered, e.g. for maintenance work or for temporary service shutdowns. For this purpose, a toggle switch or a triggering button is located on the front face of the switch.

Another known method is to combine a transmission line protection switch with an FI module, in order to obtain a situation whereby during the detection of a fault current situation by the FI module a transmission line shutdown can take place via the transmission line protection switch.

The monitoring and fuse protection devices described above are used in practice in the form of the individual components described in a variety of ways. For example, individual electrical circuits or consumer branches, which include a large number of different electrical consumers, each fuse-protected by appropriately dimensioned components. In this arrangement, in different branches appropriate approaches to the dimensioning of the components are applied, mostly involving a hierarchical fusing design. This means fusing is also effected at different voltage levels of a network such that they are separate from one another.

The problem addressed by the present invention on the other hand is to develop a monitoring and safety design, which is suitable for such an application in which a single electrical energy consumer is to experience a fusing system specially customised to its consumer circuit, independent of other consumers.

SUMMARY OF THE INVENTION

This problem is solved by means of a device for providing electrical energy to a consumer electrical circuit, said device having the following features: it has a protection and monitoring device assigned individually to the consumer, to the output of which the consumer electrical circuit can be connected via connecting means, wherein the protection and monitoring device has sensor means for detecting at least one electrical quantity, and an analysis device controlled by the sensor means, which contains parameterisation means for specifying in a predefinable manner at least one safety relevant triggering criterion, wherein on the at least one safety relevant triggering criterion being reached, a switching device for the consumer electrical circuit can be controlled.

In a method for providing electrical energy to the electrical circuit of a consumer, this problem is solved by the following steps:
  detection of at least one electrical quantity in the consumer electrical circuit and forwarding this to an analysis device,
  specification of a parameter for at least one safety-relevant triggering criterion in the analysis device,
  controlled switching of the consumer electrical circuit on and off on reaching the at least one safety relevant triggering criterion.

This solution is characterised in that, in contrast to the known fuse protection design described above consisting of individual monitoring devices, a plurality of sensors or functional modules respectively can be dispensed with, if a design is pursued which is customised to the fuse protection of a single consumer circuit. This results in corresponding materials and therefore cost savings, since multiple functionalities can be eliminated. By providing a largely optional parameterisation for the at least one triggering criterion, even the disadvantage of the known excess current protection devices can be eliminated, that e.g. a transmission line protection switch can only be inadequately parameterised with respect to its fusing characteristic (current-time-characteristic), since the characteristic curve is defined substantially by the material properties of the bimetallic device used. Of particular importance here also is the fact that a level of integration can hereby be achieved to the extent that only a single switch is required, which can be assigned to the various functions (fault current monitoring, excess current monitoring, switching off by tripping) as desired.

Further advantages of the solution according to the invention are obtained, as described in the embodiments described in the dependent claims:

Due to the fact that the fuse protection and monitoring device has an excess current monitoring means, which detects the size and/or the temporal course of the electrical current supplied, the functionality of a transmission line protection switch can be simulated.

If a maximum permissible value in the consumer electrical circuit can be pre-specified by the parameterisation means, this results in effective excess current protection in the event of a short circuit.

Due to the fact that the current-time characteristic corresponds to a pre-specifiable fusing curve, the behaviour of a transmission line protection switch for thermal overload protection can be simulated, in fact with considerably improved variability relative to conventional passive transmission line protection switches.

Due to the fact that the protection and monitoring device has a fault current monitoring means, the functionality of an FI switch can be simulated, wherein both the occurrence of an AC fault current (FI switch of Type A) and the occurrence of a DC fault current (FI switch of Type B) can be monitored.

Preferably, both a Hall sensor means and a current transformer are suitable for use as sensor means.

Suitable devices for the switching device include a power current switch, in particular a relay, a trip switch, a power transistor, a power thyristor or a combination of these components.

In one configuration of the device according to the invention, an energy quantity meter fed by an energy supply device is placed upstream of the protection and monitoring device, so that the quantity of energy extracted by the consumer can be detected and recorded.

Of special note also is the fact that each consumer can be assigned a separate protection and monitoring device, which means that optimisation is achieved in terms of both expenditure and adaptability. In this arrangement each consumer is assigned a separate energy quantity meter, which means that each unit is to be regarded as a self-contained individual system ("stand-alone").

Further particular characteristics of the solution according to the invention are to be seen in that that the protection and monitoring device can incorporate a telemetric function. Of particular importance is the possibility of remote maintenance and the monitoring of faulty functioning or error conditions. For example, remote restarting is made possible following the triggering of the switching means. A particular safety function can also be found in the fact that when a fault occurs a non-live state can be obtained by switching off all phases. This is important if there is no external backup supply for the monitoring means present.

In a further configuration of the solution according to the invention it is provided that the protection and monitoring device receives the pilot signal of a charging control circuit of the charging stations as one of its input signals, or alternatively, that the protection and monitoring device receives the "Plug Present" signal of a charging control circuit as one of its input signals.

BRIEF DESCRIPTION OF THE DRAWINGS

In the following, the subject matter of the invention will be described in more detail with the aid of a drawing showing an exemplary embodiment. The drawings show:

FIG. 1 shows a consumer 2, which can be an electrical consumer in the form of an electric vehicle, which can be connected via a connecting means 10, e.g. a cable, to a supply device 12 in the form of a charging station.

DETAILED DESCRIPTION OF THE INVENTION

Figure 1:
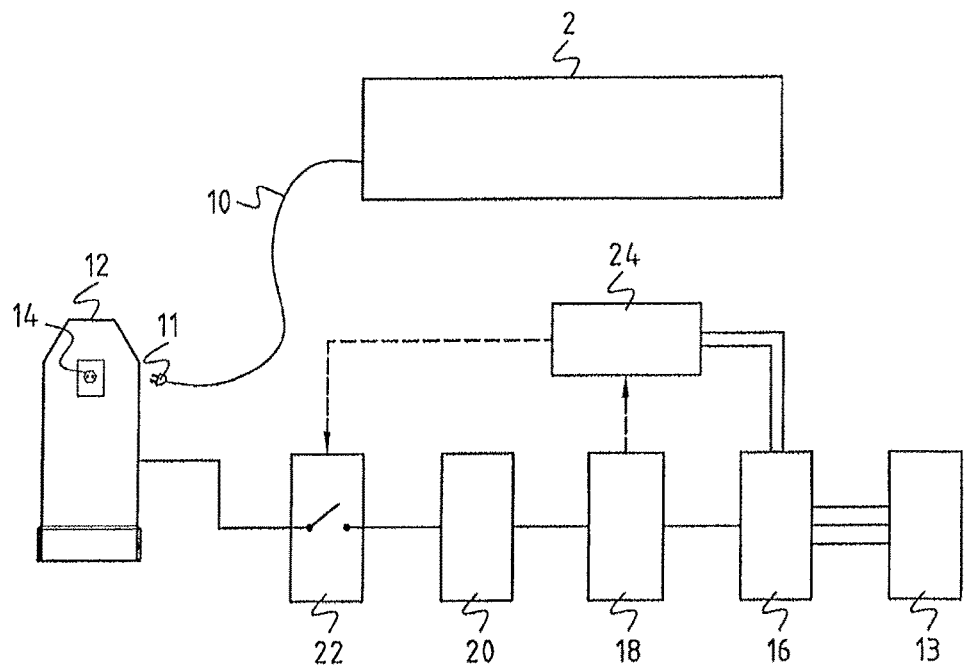
FIG. 1 a block circuit diagram for the structure of a known system consisting of a consumer and a supply device connected thereto via a connecting means.

The charging station 12 has a socket 14, monitoring and protection components 18, 20, 22, and an energy quantity meter 16, which is connected to the terminal box of a mains energy supply 13. During the charging of the battery of the vehicle 2 via the cable 10, current flows from the mains energy supply 13 via the meter 16 and the socket 14 and via the cable 10, into the battery. The meter 16 counts the quantity of energy flowing into the battery.

The monitoring and protection components comprise an FI switch 18, a passive transmission line protection switch 20 and a trip switch 22 for providing a controlled switching of the load electrical circuit on and off.

The control of the trip switch 22 is effected via a charging stations gateway computer 24. The transmission line protection switch 20 works in a known manner, i.e. it is a component which automatically switches off the electrical circuit in the event of overload. Thus the load electrical circuit is protected from damage by excessive heating, which would result from the excess current flowing over an extended period, wherein the excess current can be caused either by an overload or by a short-circuit. If triggering occurs due to overload, disconnection occurs if the specified nominal value of the current flowing through the transmission line protection switch is exceeded over an extended period of time. The time elapsed until triggering depends on the level of the excess current and varies according to the curve representing a current-time characteristic.

If a short-circuit occurs in the system a very fast triggering occurs, usually within a few milliseconds. The transmission line protection switch 20 can also be manually triggered, e.g. for maintenance work or for a temporary shutdown. For this purpose, a toggle switch or a triggering button is located on the front face of the switch 20. After it has been triggered, the switch 20 can be switched on again manually by the operator of the charging station.

The FI switch 18 is also provided with an external mechanical button activation, as is known in the prior art, in order to allow appropriate manual procedures to be carried out. Such manual procedures can be for example routine tests in relation to the FI switch 18.

Figure 2:
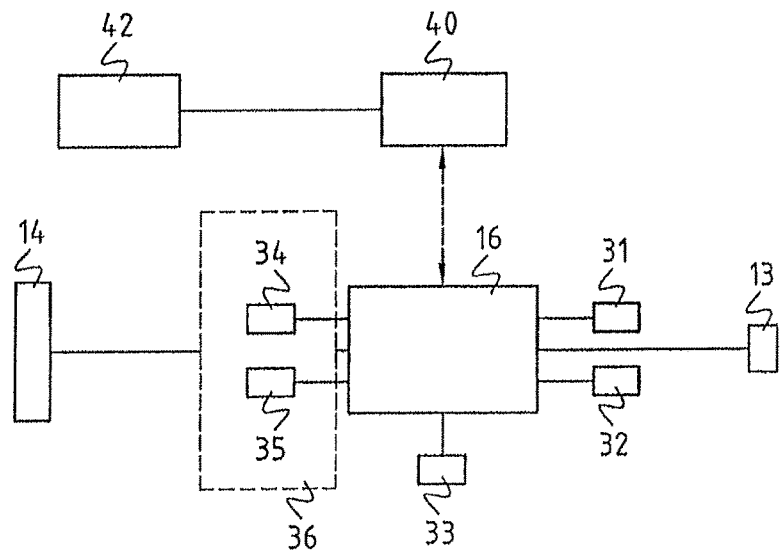
FIG. 2 a detail of the energy quantity meter corresponding to the exemplary embodiment shown in FIG. 1.

As can be seen from FIG. 2, the energy quantity meter 16 contains on its input side, i.e. on its connector facing the mains energy supply 13, a first detector 31 for the phase voltage present at this measurement point, and a second detector 32 for the phase current flowing into the meter 16. The detectors 31, 32 are designed as detectors for the corresponding electrical quantities, e.g. as toroidal core current transformers, Hall sensors etc. From the output signals of the detectors 31, 32 the quantity of energy supplied over a specified period of time is calculated and this can be presented for viewing on a display device 33 of the meter 16.

The meter 16 is a remotely readable meter, which is connected via a communications network 40 to a central charging unit 42. The communications network 40 can be part of the mains energy supply 13, so that for example communication can take place over the energy supply network 13 by means of Power-Line-Communication. The communications network 40 can also be a wired or wireless communications network. To effect communication, an IP-protocol for example can be used.

On its output side the meter 16 not only has a display device 34 for the calculated quantity of energy but also an additional output unit 35 for the phase current, which is detected by means of the detector 32. The additional output unit 35 can output the measurement value of the detector 32 directly or a post-processed signal derived from this measurement value. As an alternative to this, the additional output unit 35 can also output the phase voltage or an appropriately post-processed signal from the detector 31. Finally it is also possible for the additional output unit 35 to emit an output signal derived jointly from the signals of the detectors 31 and 32, in particular the active phase power.

The additional output unit 35, as is the output unit 34, is assigned a data interface 36 for the measured energy quantity, wherein this data interface can be constructed separately from or together with (as shown in FIG. 2) the data interface for the energy quantity.

Via the data interface 36, the phase current or another electrical signal is provided, for further processing in association with the monitoring and protection device described in the following.

Figure 3:
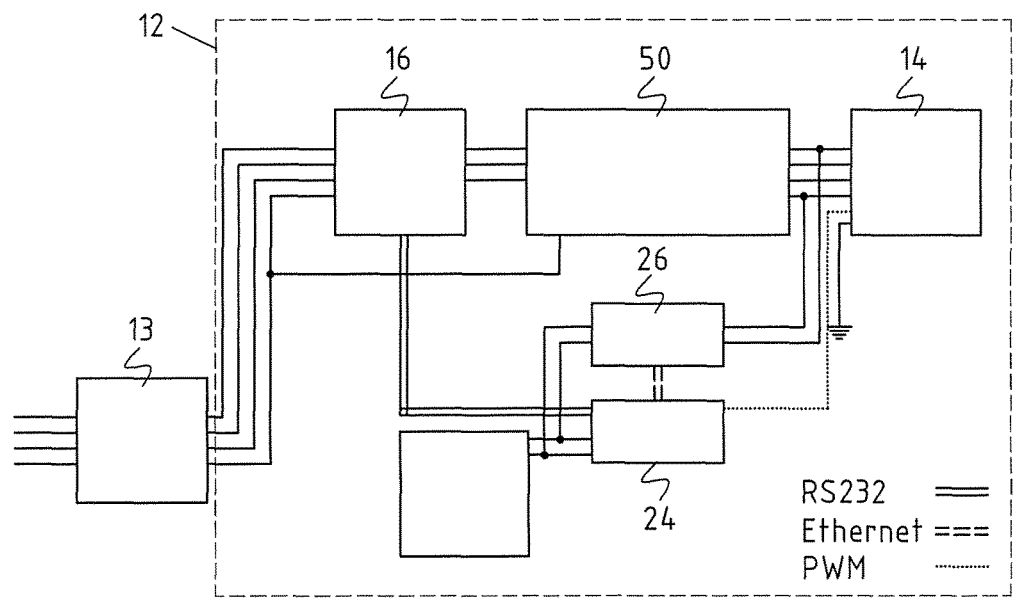
FIG. 3 a block circuit diagram of a monitoring and protection device of a supply device for a consumer according to the exemplary embodiment of the invention.

The design of a charging station for electric vehicles according to the present exemplary embodiment of the invention is explained in connection with FIG. 3 as follows:

The electrical supply line leading from the mains energy supply 13, which can be a three-phase AC current line, discharges into a terminal box inside the charging station 12. From there, the cables are passed on to the "electricity meter" 16, which preferably has the form of a digital energy quantity meter as described above in connection with FIG. 2, and its output value is transmitted over an RS 232 serial interface or another type of serial or parallel interface to a charging station gateway computer (LSG) 24 for analysis of the quantity of energy measured. On leaving the energy quantity meter 16 the lines are passed on in three-phase form to an integrated digital monitoring and protection device 50.

The socket 14 of the charging station, via which the desired energy is supplied to the electric vehicle 2 with the aid of the charging cable 10, is located on the output side of the integrated digital monitoring and protection device 50.

The communication between the socket 14 and the charging station gateway computer LSG 24 takes place e.g. via PWM technology, while the communication between the charging station gateway computer 24 and the Powerline communications module PLC 26 takes place for example via the Ethernet protocol.

Figure 4:
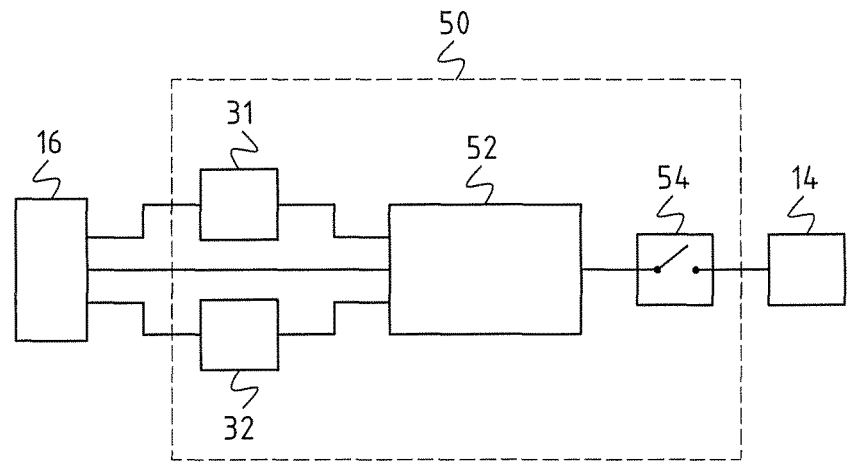
FIG. 4 a detail drawing of a monitoring and protection device of a supply device according to FIG. 3.

The basic structure of the integrated digital monitoring and protection device 50 is shown in connection with FIG. 4. The device 50 contains an analysis device 52, at the input of which the output signals of sensors 31, 32 for electrical signals are applied, in particular for the phase current and the phase voltage. These sensors 31, 32 can be for example the same components, which also form the input signals for the energy quantity meter described in connection with FIG. 2.

The electrical input values are processed further with regard to their amplitude and temporal behaviour within the analysis circuit 52 and compared with parameters stored inside the analysis circuit 52 or predefined elsewhere. As a result, by specification of the parameters triggering criteria are defined, on reaching which at the output of the analysis circuit 52 a control signal is output. As a consequence of this the load electrical circuit is switched, i.e. either switched on, if it had been previously switched off, or switched off if it had been previously switched on.

The following section describes the functionalities that can be implemented with such a design:

By means of the sensors 31, 32 the temporal behaviour of the currents or voltages in the charging electrical circuit can be detected and analysed. Due to the constant detection these signals and their analysis results are also available for regular documentation. Moreover the output signals of sensors 31, 32 can also be made available via suitable interfaces to other components of the charging circuit. The application shown in connection with FIG. 2 for the energy quantity meter 16 is only one of the possibilities.

In the event of a maximum permissible amplitude value being exceeded in the current trajectory the switching means 54 is controlled, so as to bring about a switching off process, which causes excess current protection to be obtained, e.g. in the short-circuit case. The safe switching of the switching means 54 can in addition be detected and monitored by means of the current or voltage detection.

One of the parameters predefined by the analysis circuit 52 can be a specific fusing characteristic, in order to simulate a specific current-time characteristic. The desired current-time behaviour can be varied over a wide range by digital emulation of the characteristic. This allows the excess current protection to be adjusted to specific specifiable triggering characteristic values. In particular it can be provided that previously stored protection characteristics are provided, from which in each case the one appropriate to the application can be selected. For example, a characteristic that is matched to a specific connector of the charging cable can be used. Thus it is possible for example, by means of a plug face or by means of a resistor arranged in the plug between a plug-present or pilot conductor and a neutral conductor, to identify a plug or a charging cable for a maximum charging current level. With this information, the respective protection characteristic can also be matched. Relative to conventional functionalities of passive transmission line protection switches, the response characteristics of which cannot be parameterised, this method produces a much greater degree of flexibility. In the context of this functionality, appropriate parameterisation of the response characteristic enables compensation to be made for the effect of the ambient temperature on the fusing conditions. This should prevent triggering of the device due solely to the effect of raised ambient temperature, without a fault actually being present. The triggering characteristic of the fuse can also be modified during operation, for example due to information discovered as a result of the analysis of the connected cable or due to discoveries about network and/or installation bottlenecks.

The digital analysis device 52 can also detect fault currents in the charging circuit by appropriate analysis of current signals and corresponding difference formation, and by controlling the switching means 54 it can cause the device to switch off. This can include the diagnosis of both AC fault currents and DC fault currents, which means that behaviour corresponding to an FI switch of both Type A and of Type B can be simulated. Of particular importance here is that in the event of a detected fault current (AC or DC) the switching means 54 can be permanently switched off and only be switched into active mode again on rebooting the charging stations gateway computer. In this case, the reboot routine can be adapted to suit this functionality. This means also that prescribed safety regulations, such as those applying within the Federal Republic of Germany, which always require the switching of a fault current protection switch to work independently of the mains voltage can also be implemented.

As a further significant safety function it can be provided that in case of failure of the mains supply the switching means is mandatorily opened. This also guarantees the FI switch functionality.

Also, according to one exemplary embodiment of the invention, an automatic testing function of the FI switch functionality can be provided. In this configuration the monitoring and protection device 50 can be forced to simulate a fault current. This can be effected for example by means of a resistor connected in a controlled manner between one phase or another conductor and the protective conductor, whereupon the relay of the FI switch is driven (and if necessary not triggered), and by this control signal being detected externally and the functionality therefore being determined to be correct. This simulation can be carried out for all three phases separately and/or at pre-specified time intervals. The particular advantage over the previous practice consists then in the fact that this—legally and mandatorily prescribed—testing function is automatically executed by an external means, without the need for a responsible person to be present at the charging station site. For example, such a test procedure can take place after completion of each charging procedure.

Owing to the previously described solution the component and wiring requirements in the charging station are quite considerably reduced, since any dual functionality, such as is unavoidable when using separate safety components, is in fact avoided.

This configuration offers considerable advantages, particularly for such applications as exist in charging stations for electric vehicles, in which an energy supply is provided to exactly one consumer. Owing to the high flexibility linked to the reduced component requirements, an optimised matching of the safety requirements to the particular requirements of the consumer is obtained.

The invention claimed is:

1. Device for providing electrical energy to a consumer electrical circuit, comprising a protection and monitoring device assigned individually to the consumer, to the output of which the consumer electrical circuit can be connected via connecting means, wherein the protection and monitoring device has sensor means for detecting at least one electrical quantity, and an analysis device controlled by the sensor means, which contains parameterisation means for specifying in a presettable manner at least one safety relevant triggering criterion, wherein on the at least one safety relevant triggering criterion being reached, a switching device for the consumer electrical circuit is automatically controlled, wherein a plurality of previously stored protection characteristics is provided from which, in each case, one of the plurality of previously stored protection characteristics is automatically selectable during the operation of the device.

2. The device according to claim 1, wherein the protection and monitoring device has an excess current monitoring means, which detects at least one of a size and a temporal course of an electrical current supplied.

3. The device according to claim 2, wherein a maximum permissible current value can be predefined in the consumer electrical circuit by the parameterisation means.

4. The device according to claim 1, wherein the protection and monitoring device has a fault current monitoring means.

5. The device according to claim 4, wherein the fault current monitoring means monitors an occurrence of an AC fault current, wherein the fault current monitoring means is an FI switch of Type A.

6. The device according to claim 4, wherein the fault current monitoring means monitors an occurrence of an DC fault current, wherein the fault current monitoring means is an FI switch of Type B.

7. The device according to claim 1, wherein the sensor means is a Hall sensor.

8. The device according to claim 1, wherein the sensor means is a current transformer.

9. The device according to claim 1, wherein the switching device is a power current switch, in particular at least one of a relay, a trip switch, a power transistor, a power thyristor or a combination of these components.

10. The device according to claim 1, wherein the protection and monitoring device has a default encoder, on the response of which the switching device can be triggered, regardless of whether the at least one triggering criterion has been reached.

11. The device according to claim 1, wherein an energy quantity meter fed by an energy supply device is provided upstream of the protection and monitoring device.

12. The device according to claim 1, wherein a separate energy quantity meter is assigned to each consumer.

13. The device according to claim 1, wherein the protection and monitoring device has a controllable reboot device.

14. The device according to claim 1, wherein the consumer is the battery of an electric vehicle and that the device for providing electrical energy is a charging station for an electric vehicle.

15. The device according to claim 14, wherein the protection and monitoring device receives a pilot signal of a charging control circuit of the charging station as one of its input signals.

16. The device according to claim 14, wherein the protection and monitoring device receives a "Plug Present" signal of a charging control circuit as one of its input signals.

17. The device according to according to claim 1, wherein the protection and monitoring device has a triggering characteristic which can be modified during operation.

18. System comprising a charging station including the Device of claim 1 which is connected to an electric vehicle.

19. Use of the protection and monitoring device of claim 1 incorporated in a charging station during the charging process of the battery of an electric vehicle.

20. The device according to claim 1, wherein the triggering criterion can be modified such that the effect of the ambient temperature on fusing conditions is compensated.

21. The device according to claim 1, wherein a connector or a charging cable is marked, and wherein from the previously stored protection characteristics, in each case, the one appropriate to the marked connector or marked charging cable is selectable.

22. Method for providing electrical energy to an electrical circuit of a separate consumer device, comprising:
   detection of at least one electrical quantity in the electrical circuit and forwarding this to an analysis device,
   specification of a parameter for at least one safety-relevant triggering criteria in the analysis device,
   controlled switching of the electrical circuit on and off on reaching the at least one safety relevant triggering criterion,
   wherein a plurality of previously stored protection characteristics is provided, from which in each case, one of the plurality of previously stored protection characteristics is automatically selected during the operation of the device.

23. Method for providing electrical energy to the charging circuit of an electric vehicle, comprising:
   detection of at least one electrical quantity in the charging current circuit and forwarding this to an analysis device,
   specification of a parameter for at least one safety-relevant triggering criteria in the analysis device,
   controlled switching of the consumer electrical circuit on and off on reaching the at least one safety relevant triggering criterion,
   wherein a plurality of previously stored protection characteristics is provided, from which in each case, one of the plurality of previously stored protection characteristics is automatically selected during the operation of the device.

* * * * *